United States Patent
Nilsson et al.

(10) Patent No.: US 8,212,699 B1
(45) Date of Patent: Jul. 3, 2012

(54) SYSTEM AND METHOD FOR EXTENDING THE OVERLOAD RANGE OF A SIGMA DELTA ADC SYSTEM BY PROVIDING OVER-RANGE QUANTIZATION LEVELS

(75) Inventors: C. Gary Nilsson, Hawthorne, CA (US); Craig A. Hornbuckle, Torrance, CA (US); Kevin William Glass, Scottsdale, AZ (US)

(73) Assignee: Semtech Corporation, Camarillo, CA (US)

( * ) Notice: Subject to any disclaimer, the term of this patent is extended or adjusted under 35 U.S.C. 154(b) by 85 days.

(21) Appl. No.: 12/795,579

(22) Filed: Jun. 7, 2010
(Under 37 CFR 1.47)

Related U.S. Application Data

(63) Continuation-in-part of application No. 12/560,288, filed on Sep. 15, 2009, now Pat. No. 7,973,689.

(60) Provisional application No. 61/097,444, filed on Sep. 16, 2008.

(51) Int. Cl.
*H03M 3/00* (2006.01)
(52) U.S. Cl. .................................. 341/143; 341/155
(58) Field of Classification Search ........... 341/130–155
See application file for complete search history.

(56) References Cited

U.S. PATENT DOCUMENTS

| | | | |
|---|---|---|---|
| 5,684,482 A | 11/1997 | Galton | |
| 6,020,836 A * | 2/2000 | Tlaskal | 341/143 |
| 6,061,010 A | 5/2000 | Adams et al. | |
| 6,396,428 B1 | 5/2002 | Cheng | |
| 6,414,615 B1 * | 7/2002 | Cheng | 341/143 |
| 6,697,004 B1 | 2/2004 | Galton et al. | |
| 6,750,795 B2 * | 6/2004 | Gupta | 341/143 |
| 6,795,002 B2 * | 9/2004 | Gupta | 341/143 |
| 6,803,870 B2 * | 10/2004 | Kuttner | 341/155 |
| 6,816,100 B1 | 11/2004 | Galton et al. | |
| 6,836,228 B1 | 12/2004 | Levinson et al. | |
| 6,911,928 B2 * | 6/2005 | Orsier et al. | 341/143 |
| 7,002,499 B2 | 2/2006 | Kaplan | |
| 7,079,068 B2 | 7/2006 | Clement et al. | |
| 7,081,843 B2 * | 7/2006 | Melanson | 341/143 |
| 7,161,507 B2 * | 1/2007 | Tomic | 341/51 |
| 7,242,337 B2 * | 7/2007 | Uemori et al. | 341/143 |
| 7,298,306 B2 * | 11/2007 | Melanson | 341/143 |
| 7,432,840 B2 | 10/2008 | Doerrer et al. | |
| 7,629,912 B2 * | 12/2009 | Le Guillou et al. | 341/143 |
| 2004/0233081 A1 * | 11/2004 | Cesura et al. | 341/118 |
| 2006/0012499 A1 * | 1/2006 | Ihs et al. | 341/143 |
| 2007/0018867 A1 | 1/2007 | Uemori et al. | |
| 2008/0309536 A1 | 12/2008 | Le Guillou et al. | |
| 2010/0066578 A1 | 3/2010 | Glass et al. | |
| 2011/0050287 A1 | 3/2011 | Glass | |

\* cited by examiner

*Primary Examiner* — Lam T Mai
(74) *Attorney, Agent, or Firm* — McDermott Will & Emery LLP; Soyeon (Karen) Pak Laub

(57) ABSTRACT

Examples of a system and method for sigma-delta analog-to-digital conversion of an electrical input signal are disclosed. An electrical input signal is received. A filtered analog signal is provided based on the electrical input signal and an analog feedback signal. A digital representation of the filtered analog signal is provided, the digital representation being one of K quantization levels, wherein K is a positive integer between $2^L$ and $2^{L+1}$, L being a positive integer. The analog feedback signal is obtained based on the digital representation.

21 Claims, 8 Drawing Sheets

SYSTEM AND METHOD FOR EXTENDING THE OVERLOAD RANGE OF A SIGMA DELTA ADC SYSTEM BY PROVIDING OVER-RANGE QUANTIZATION LEVELS

CROSS REFERENCE TO RELATED APPLICATIONS

This application is a continuation-in-part of U.S. application Ser. No. 12/560,288, filed Sep. 15, 2009, issued as U.S. Pat. No. 7,973,689 on Jul. 5, 2011, which claims the benefit of priority under 35 U.S.C. §119 from U.S. Provisional Application Ser. No. 61/097,444, filed on Sep. 16, 2008, each of which is hereby incorporated by reference in its entirety for all purposes.

FIELD

The subject technology generally relates to analog-to-digital converters, and more particularly, relates to systems and methods for extending the overload range of a sigma delta ADC system by providing over-range quantization levels.

BACKGROUND

The term ADC may refer to an analog-to-digital converter (s) or analog-to-digital conversion. A sigma-delta modulation is a popular technique for coding data streams. The technique may provide powerful means for analog-to-digital conversion and digital-to-analog conversion with low circuit complexity and large robustness against circuit imperfections.

A sigma-delta modulated system (e.g., sigma-delta ADC) may display limit cycle oscillations that result in periodic (tone) components in the output and that can negatively impact performance (e.g., stability and accuracy) of the system. Limit cycle oscillations can be caused by an analog input of the ADC exceeding an overload range of a sigma delta ADC system. Such overload condition may be caused, e.g., by the presence of a temporary noise or signal spike from an interfering jammer, or a system switching transient in the input analog signal.

SUMMARY

In certain aspects of the disclosure, a sigma-delta analog-to-digital conversion system for data conversion of an electrical input signal is provided. The system can comprise a filter module configured to receive an electrical input signal and an analog feedback signal and to provide a filtered signal. The system can further comprise an extended-range multi-bit quantizer coupled to the filter module and configured to provide a digital representation of the filtered signal, the quantizer having K quantization levels, K being a positive integer between $2^L$ and $2^{L+1}$, L being a positive integer. The system can further comprise a feedback digital-to-analog converter (DAC) module coupled to the extended-range multi-bit quantizer and configured to provide the analog feedback signal to the filter module, the feedback DAC module comprising a digital-to-analog converter configured to provide an analog representation of the digital representation.

In certain aspects of the disclosure, a method of performing a sigma-delta analog-to-digital conversion of an electrical input signal is provided. The method can comprise receiving an electrical input signal. The method can further comprise providing a filtered analog signal based on the electrical input signal and an analog feedback signal. The method can further comprise providing a digital representation of the filtered analog signal, the digital representation being one of K quantization levels, wherein K is a positive integer between $2^L$ and $2^{L+1}$, L being a positive integer. The method can further comprise obtaining the analog feedback signal based on the digital representation.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

DETAILED DESCRIPTION

Figure 1:
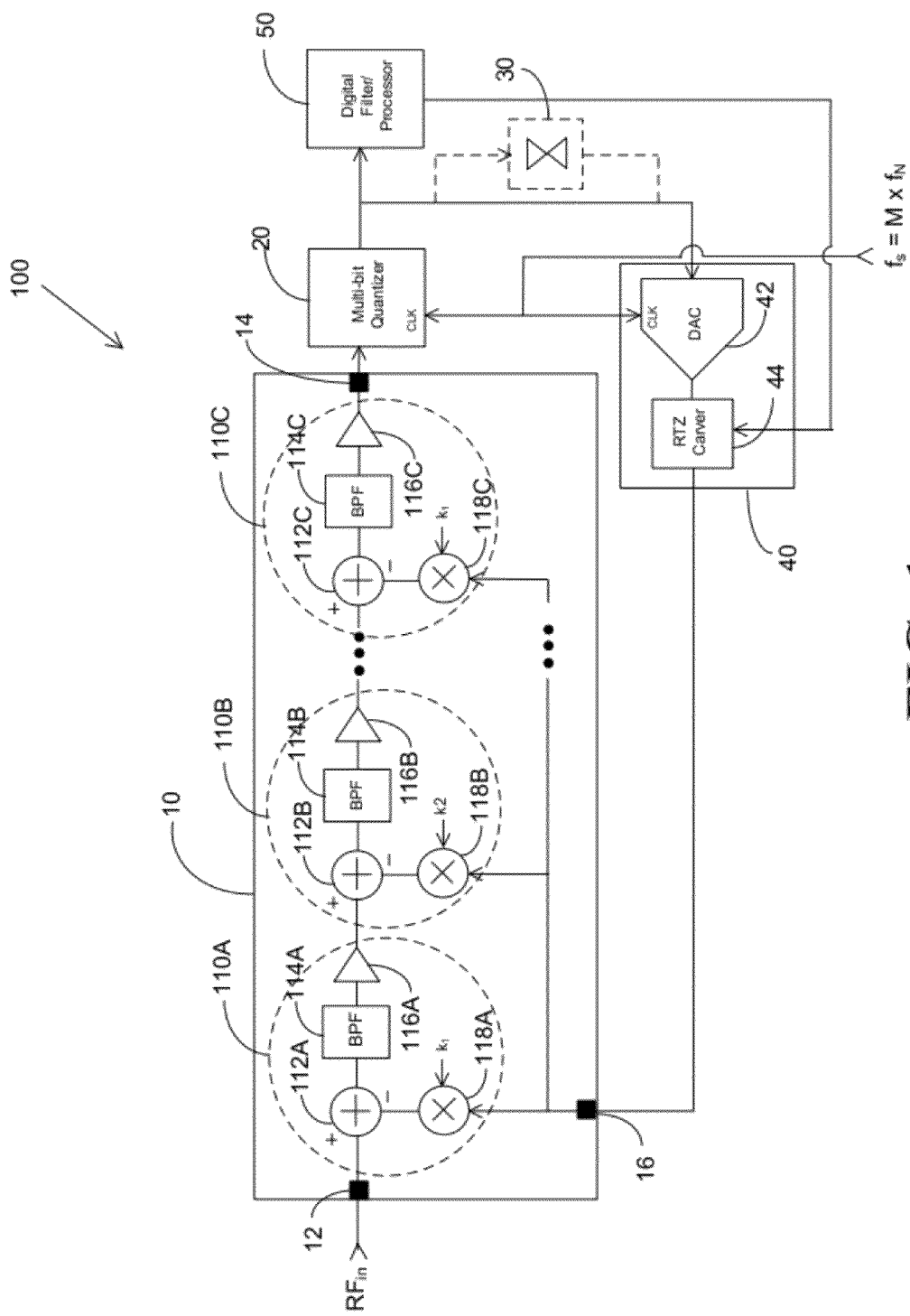
FIG. 1 is a schematic block diagram of an exemplary bandpass multi-bit sigma-delta conversion system according to one aspect of the subject technology.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be apparent to those skilled in the art that the subject technology may be practiced without these specific details. In some instances, well-known structures and components are shown in block diagram form in order to avoid obscuring the concepts of the subject technology. Like components are labeled with identical element numbers for ease of understanding.

Traditional radio systems have used high quality local oscillators and precision mixers, and analog filters for selectivity. These systems are generally for dedicated point solutions for a specific radio standard. Multi-mode operation can be problematic and can require totally separate and dedicated radio receivers. In one aspect, a "software defined radio" approach may be utilized, where a wideband analog to digital conversion is performed at radio frequency (RF), and digital signal processing (DSP) is used to perform the previously analog receiver functions. Multi-mode operation can be supported by changing the DSP program running on the same hardware. Defining the radio in software also allows "agile" operation—switching between standards on the fly. "Cognizant" operation—where the radio receives the transmitted spectrum, and decides what radio standard is being used and shifts to the appropriate software—is also enabled. In one aspect of the disclosure, a missing element necessary to implement a software-defined radio may be a high frequency, high dynamic range analog-to-digital converter.

Aspects of the subject technology relate to the implementation of software-defined radio. Configurations of the subject technology enable operation of a sigma-delta converter at a high enough frequency to support various technologies such as cellular phone, wireless networking, or radar. According to one example, a configuration of the subject technology is capable of operation at the full RF frequency without a front-end mixer.

By way of illustration and not limitation, in one aspect, a "sigma-delta analog-to-digital conversion" may refer to a type of analog-to-digital conversion scheme that oversamples a desired signal by a large factor and filters a desired signal band. Generally, a smaller number of bits than required may be converted using, for example, a quantizer (e.g., a Flash ADC) after a filter. The resulting signal, along with the error generated by the discrete levels of the quantizer, may be fed back and subtracted from the input to the filter. This negative feedback can have the effect of noise shaping the error due to the quantizer so that it does not appear in the desired signal frequencies. A digital filter (decimation filter) may follow the quantizer to reduce the sampling rate, filter off unwanted noise signal and increase the resolution of the output.

FIG. 1 is a schematic block diagram of an exemplary bandpass multi-bit sigma-delta conversion system 100 according to one aspect of the subject technology. The system 100 may include some or all of the following: a bandpass filter module 10, a multi-bit quantizer 20, an optional mismatch shaping circuit 30, a feedback digital-to-analog converter (DAC) module 40, and a digital filter and/or processor 50.

The bandpass filer module 10 may include an RF input 12, an output 14, and a feedback input 16. The bandpass filter module 10 may be configured to receive an RF input signal, e.g., from an antenna (not shown) and provide a bandpass-filtered signal at the output 14 based on the received RF input signal and an analog feedback signal received at the feedback input 16. The analog feedback signal will be described below with respect to the feedback DAC 40. In the illustrated example, the bandpass filter module 10 is a multi-pole bandpass filter module that includes a predetermined number (N) of filter stages 110A, 110B, 110C (corresponding to N poles). Each filter stage includes a subtractor (e.g., 112A, 112B or 112C), a bandpass filter (e.g., 114A, 114B or 114C), an amplifier (e.g., 116A, 116B or 116C), and a multiplier (e.g., 118A, 118B or 118C). In each filter stage, the corresponding bandpass filter 114A, 114B or 114C and the corresponding amplifier 116A, 116B, or 116C is characterized by a quality factor (Q) and a gain (G), respectively. In certain embodiments, the RF input signal has a carrier frequency in the range of 500 MHz to 5 GHz. In some examples, a bandpass filter may have lower and upper cutoff frequencies in accordance with or specified in various communication standards including, but not limited to, DCS, PCS, GSM, EDGE, IS95, CDMA, CDMA2000, WCDMA, LTE, 802.16, 802.11, and wideband frequency-hop or spread-spectrum radars. In some embodiments, a bandpass filter may be employed as part of a software-defined radio system that is configured to algorithmically select all or some of the above-mentioned communication standards. While the bandpass filter module 10 is described above with respect to an RF input signal, the bandpass filter module 10 can receive any electrical signal including, but not limited to, a cable signal, a fiber optic signal, a wireline (e.g., telephony) signal, and a radar signal.

The multi-bit quantizer 20 may be coupled to the bandpass filter module 10 and configured to receive the bandpass-filtered signal therefrom and to provide a multi-bit digital representation of the bandpass-filtered signal after the quantization. The multi-bit quantization can improve dynamic range for a given sampling frequency and bandwidth because it allows the input to get closer to the maximum range over which limit cycles or oscillations set in and also improve stability because it allows for a lower gain to be used. In addition, the multi-bit quantization also relaxes dynamic range requirement for the first filter stage on input, and reduces input overload margin.

The multi-bit quantization can be performed at a sampling frequency $f_s$ associated with a clock signal provided at a clock input of the quantizer 20. As applied to sigma-delta converters the sampling frequency $f_s$ is often expressed as $M \times f_N$, where M is the so-called "oversampling" factor and $f_N$ is Nyquist frequency, which is typically defined as twice the bandwidth of interest. In some embodiments, the bandpass multi-bit sigma-delta ADC system 100 includes a clock (not shown) for generating the clock signal. In other embodiments, the clock signal is provided by some other system clock or the processor 50.

The quantizer 20 can be implemented as a multi-bit analog-to-digital converter such as a flash ADC. An example of a flash ADC is described in U.S. patent application Ser. No. 12/551,447 entitled, "High Speed Track and Hold Circuit," which is hereby incorporated by reference. In certain embodiments, the multi-bit quantizer is an L-bit ADC, where L is usually, but not limited to, an integer value such as 2, 3, 4, or 5.

The feedback DAC module 40 may be coupled to the multi-bit quantizer 20, either directly or indirectly via the optional mismatch shaping circuit 30, and is configured to receive the digital representation and to provide the analog feedback signal to the bandpass filter module 10 at the feedback input 16 as discussed above with respect to the bandpass filter module 10. In certain embodiments, the feedback DAC module 40 has the same number of bits (e.g., L bits) as the quantizer 20. In other embodiments, the number of bits can be different from the quantizer 20 and the feedback DAC module 40.

Because of circuit errors such as component mismatches (e.g., between the quantizer 20 and the feedback DAC module 40), data conversion by the feedback DAC module can introduce conversion noise. The conversion noise is not attenuated by the processing chain and can directly degrade the overall signal-to-noise-ratio (SNR) of the sigma-delta analog-to-digital conversion system 100. To the extent that the conversion noise consists of nonlinearities (e.g., harmonic distortion), the spurious-free dynamic range (SFDR) of the data converter is also reduced. In certain embodiments, an optional mismatch shaping circuit such as the mismatch shaping circuit 30 is provided between the quantizer 20 and the feedback DAC module 40 to reduce the conversion noise and nonlinearities. The mismatch shaping circuit 30 may randomly switch unitary bits of the quantizer 20 and the feedback DAC module 40 so as to randomize the conversion noise and nonlinearities. For example, the mismatch shaping circuit 30 may randomly or under an algorithmic control map unitary bits of the quantizer 20 to individual unitary DAC elements. This randomization results in noise-shaping, reduced conversion noise and/or improved linearity for the entire sigma-delta analog-to-digital converter system 100. The mismatching methodology and implementations thereof are described in detail in U.S. Pat. No. 5,684,482, which is incorporated herein by reference in its entirety, and are not repeated here for the sake of brevity.

In the illustrated example, the feedback DAC module 40 is a return-to-zero (RTZ) DAC that includes a DAC 42 and an RTZ carver circuit 44. The DAC 42 is configured to receive the multi-bit digital representation from the quantizer 20, either directly or via the mismatch shaping circuit 30, and to provide an analog representation of the multi-bit digital representation.

Figure 2:
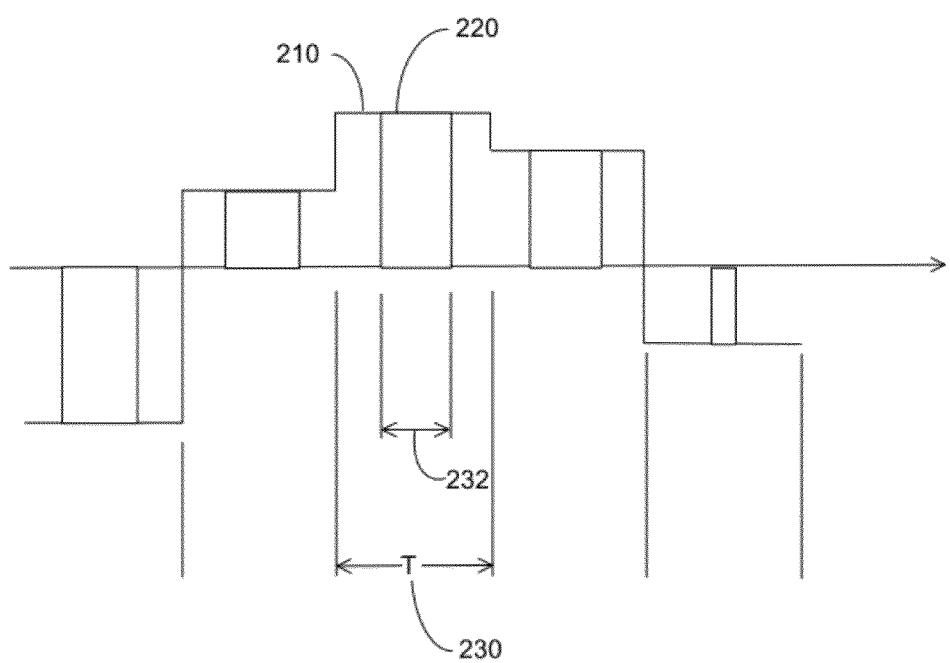
FIG. 2 is a graph illustrating a selection of a certain temporal portion of the analog representation within each sampling period by a return-to-zero (RTZ) carver circuit according to one aspect of the subject technology.

In one aspect, the RTZ carver circuit 44 may be configured to select a certain temporal portion 232 of the analog representation 210 within each sampling period 230 as illustrated in FIG. 2. (Here the sampling period 230 is an inverse of the sampling frequency discussed above, i.e., $T=1/f_s$. The RTZ carver "duty cycle" is defined as $232/T$.) Therefore, within each sampling period, the output 220 of the RTZ carver circuit 44 remains zero except during the selected temporal portion 232 where the output of the RTZ carver circuit 44 rises to a level corresponding to 1/duty cycle multiplied by the output of the DAC 42 (e.g., the analog representation 210).

In one aspect, the use of such an RTZ carver circuit as part of the feedback DAC 40 is advantageous in that the circuit acts as a generator of a phase lead term that can compensate any phase lags introduced by one or more components of the sigma-delta analog-to-digital conversion system. The phase compensation can further improve the stability of the sigma-delta analog-to-digital conversion system. In certain embodiments, the selected temporal portion 232 (e.g., the position and/or the width) is adjustable to maximize the phase compensation and minimize the effect of any unknown phase lags introduced, for example, by the quantizer 20 and/or the feedback DAC module 40.

Figure 3:
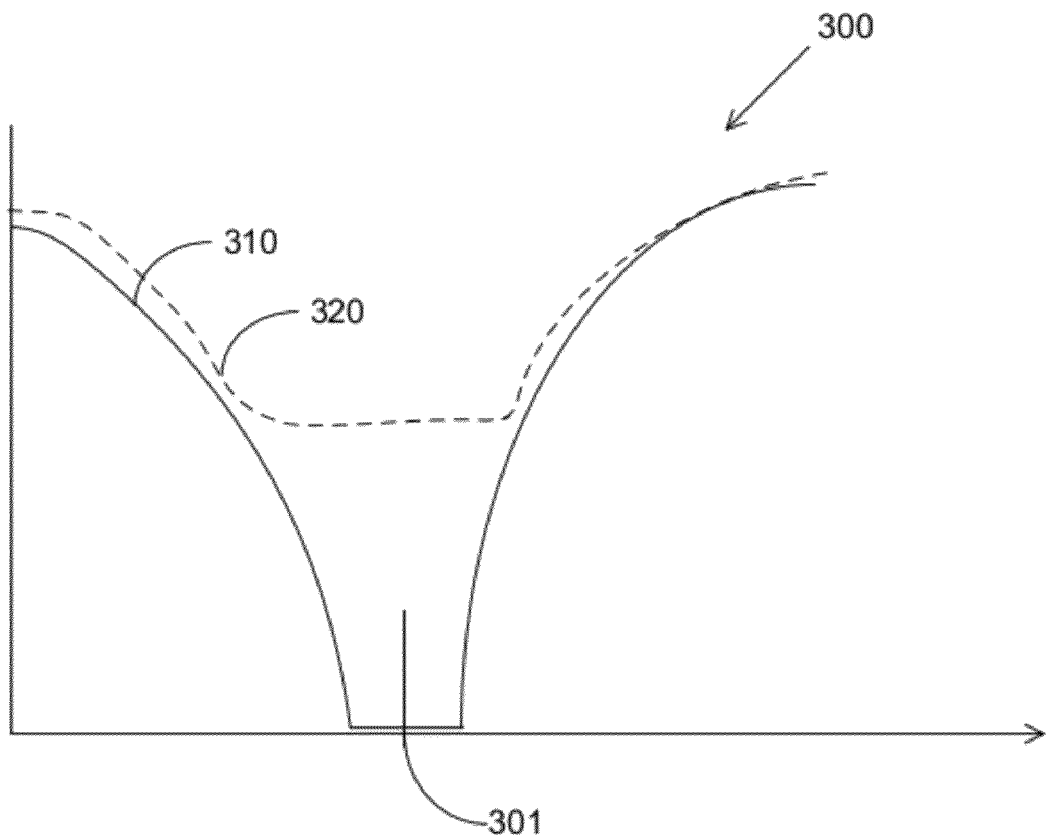
FIG. 3 is a graph illustrating an uncompensated noise-shaping spectrum and a fully compensated noise-shaping spectrum.

By way of example, FIG. 3 shows an uncompensated noise-shaping spectrum 320 and a fully compensated noise-shaping spectrum 310 obtained by adjusting the position (e.g., the beginning time) of the selected temporal portion, which is equivalent to adjusting the amount of the phase lead. In the illustrated example, the duty cycle for the selected portion 232 remains constant at about 50% throughout different sampling cycles, although, in alternative embodiments, the duty cycle can be varied from cycle to cycle. In the illustrated example of FIG. 1, the phase adjustment is achieved through a phase adjustment signal provided by a digital filter and/or signal processor 50. In certain embodiments, the phase adjustment is carried out programmatically until attenuation in the notch of the noise-shaping spectrum at a selected frequency 301 is maximized.

One problem with the utilization of multi-bit quantization is the extreme linearity required for the quantizer 20 and the feedback DAC module 40, and the matching required between them. To mitigate this problem, calibration of both elements is employed in accordance with one aspect of the subject technology. Calibration of the bandpass filter module 10 and the feedback filters 30 is also employed in accordance with another aspect of the subject technology. It shall be apparent to those skilled in the art that numerous calibration approaches and algorithms can be employed.

Returning to FIG. 1, the analog feedback signal provided by the feedback DAC module 40 is fed into the feedback input 16 of the bandpass filter module 10. The analog feedback signal is split and fed into inputs of multipliers 118A, 118B, 118C associated with different filter stages 110A, 110B, 110C. Within each filter stage, the analog feedback signal is multiplied by a different multiplication factor (e.g., $k_1$, $k_2$, $k_3$). The outputs of the multipliers 118A, 118B, 118C are in turn fed into inputs of the subtractors 112A, 112B, 112C. In the first filter stage 110A, the output of the multiplier 118A is subtracted from the RF input signal by the subtractor 112A to provide a first residue signal that is in turn fed into the bandpass filter 114A. In the second filter stage 110B, the output of the multiplier 118B is subtracted from the output of the first filter stage 110A by the second subtractor 112B to provide a second residue signal that is in turn fed into the bandpass filter 114B. In the last ($N^{th}$) filter stage 110C, the output of the multiplier 118C is subtracted from the output of a previous $(N-1)^{th}$ filter stage by the subtractor 112C to provide an $N^{th}$ residue signal that is in turn fed into the bandpass filter 114C.

It shall be appreciated by those skilled in the art that many different ways of implementing a bandpass filter are known in the art and that the particular bandpass filter module 10 shown in FIG. 1 is provided for illustration purpose only. Any type of bandpass filters including, but not limited to, active filters of various topologies, $G_mCL$, $G_mC$, passive, and the like may be used.

The number of poles (N) associated with the bandpass filter module 10 and the number of quantization bits (L) associated with the quantizer 20 are some of design parameters that can be determined at the design stage based on desired performance characteristics such as desired noise-shaping spectrum.

Figure 4:
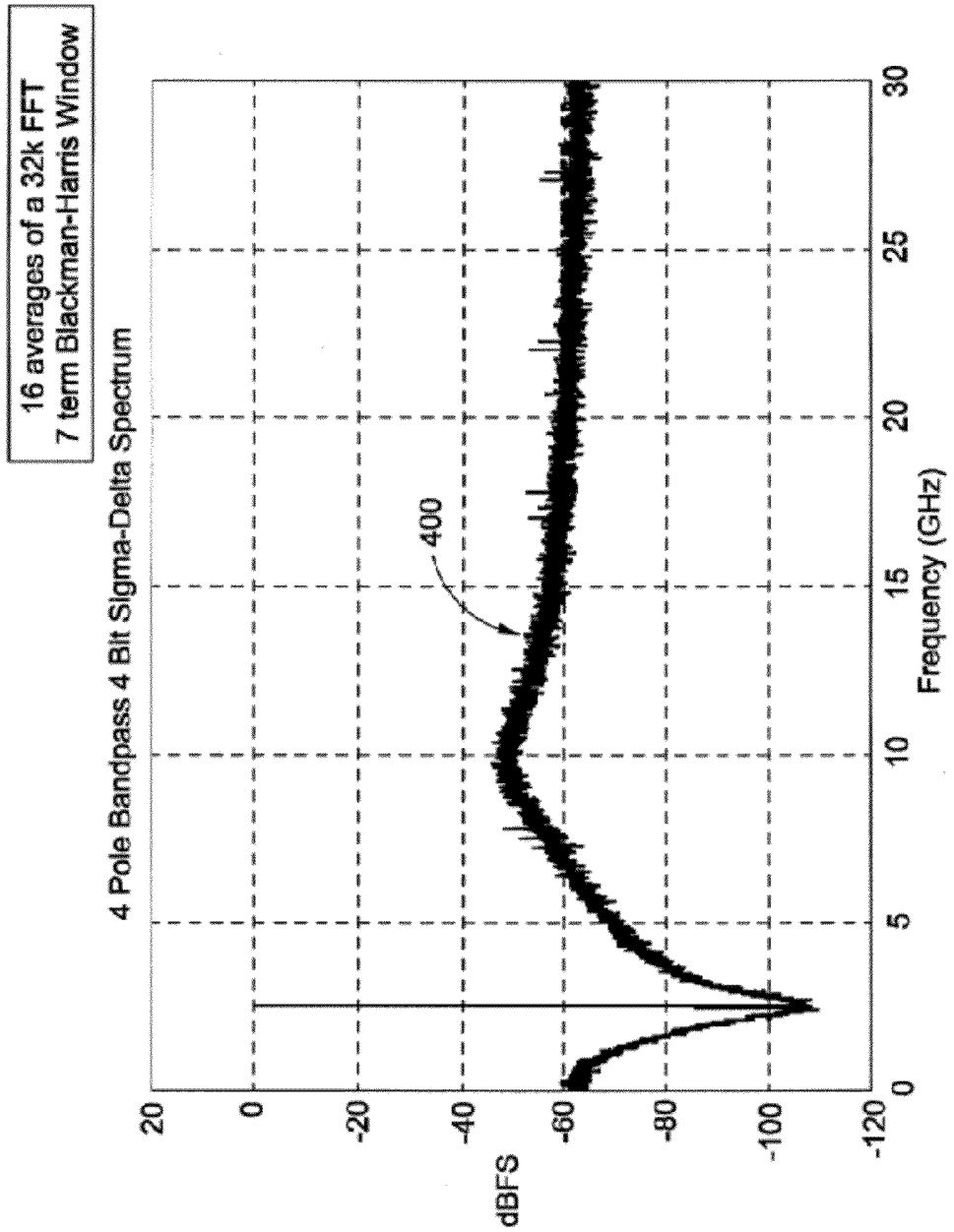
FIG. 4 is a graph showing an exemplary noise-shaping spectrum obtained from a 4 pole 4 bit (N=4; L=4) sigma-delta conversion system.

FIG. 4 shows an exemplary noise-shaping spectrum 400 that is obtained from a 4 pole 4 bit (N=4; L=4) sigma-delta conversion system. In the illustrated example, the noise-shaping spectrum 400 has a maximum attenuation at a selected peak noise rejection frequency of about 2.5 GHz.

Returning to FIG. 1, the multi-bit digital representation of the bandpass-filtered signal provided by the multi-bit quantizer 20 may be also fed into the digital filter and/or processor 50 for further processing. For example, in a software-defined radio system, certain digital processing functions such as digital filtering, demodulation and decoding can be performed by the digital filter and/or processor 50 to extract information from the digitized RF signal. In certain embodiments, at least some of the digital processing functions can be performed by a digital signal processor (DSP) executing a software program stored in a memory. In some of such embodiments, some of the digital processing functions (e.g., digital filtering) are performed by a dedicated logic circuit while other digital processing functions (e.g., decoding) are performed programmatically by the DSP. Alternatively, all of the digital processing functions can be performed programmatically by the DSP or implemented in a field programmable gate array (FPGA).

Figure 5:
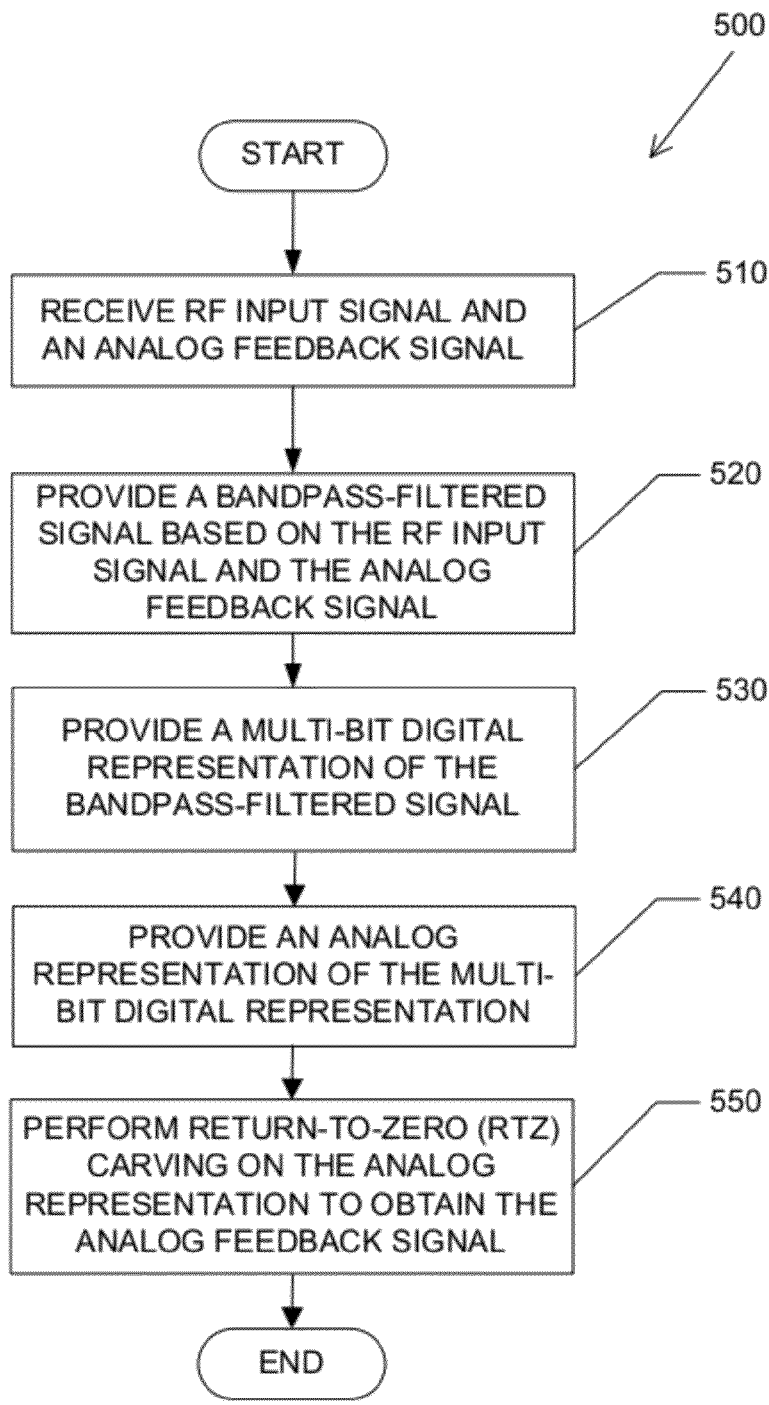
FIG. 5 is a flowchart illustrating an exemplary process for performing a sigma-delta analog-to-digital conversion of a radio frequency (RF) input signal according to one aspect of the subject technology.

FIG. 5 is a flowchart illustrating an exemplary process 500 for performing a sigma-delta analog-to-digital conversion of a radio frequency (RF) input signal according to one aspect of the subject technology. For ease of illustration, various operations of the process 500 will be described with respect to the exemplary bandpass multi-bit sigma-delta analog-to-digital conversion system 100 of FIG. 1. However, it shall be appreciated by those skilled in the art that the process 500 or a variation thereof can be implemented in a different configuration of bandpass multi-bit sigma-delta analog-to-digital conversion system without departing from the scope of the present disclosure. The process 500 begins at start state and proceeds to operation 510, in which an RF input signal to be digitized and an analog feedback signal are received, e.g., by the bandpass filter module 10. The process 500 proceeds to operation 520, in which a bandpass-filtered signal that is generated based on the RF input signal and the analog feedback signal is provided, e.g., by the bandpass filter module 10.

The process 500 proceeds to operation 530, in which a multi-bit digital representation of the bandpass filtered signal is provided, e.g., by the quantizer 20. The process 500 proceeds to operation 540, in which an analog representation of the multi-bit digital representation is provided, e.g., by the DAC 42. The process 500 proceeds to operation 550, in which a return-to-zero carving operation is performed on the analog representation, e.g., by the RTZ carver circuit 42, to obtain the analog feedback signal. As explained above, the analog feedback signal is used e.g., by the bandpass-filter module 10 in conjunction with the RF input signal to provide the bandpass-filtered signal.

Although not shown in FIG. 5, additional digital processing operations (e.g., filtering, demodulation, and decoding) may be performed on the multi-bit digital representation to extract information carried by the RF input signal as part of providing, for example, a software-defined radio system.

As discussed above, a sigma-delta ADC system may display limit cycle oscillations that result in periodic (tone) components in the output and that can negatively impact performance (e.g., stability and accuracy) of the system. One of the causes of the limit cycle oscillations in a sigma-delta ADC system is an analog input signal exceeding a nominal input range of the system. For example, suppose that the bandpass multi-bit sigma-delta conversion system of FIG. 1 is a 4-bit system (L=4) having a nominal input range of +/−1,000 mV. An overload analog input signal (e.g., 1,080 mV) exceeding the +/−1,000 mV nominal input range can set off a limit cycle oscillation.

In certain aspects of the present disclosure, an extended-range multi-bit quantizer that provides M additional levels over $2^L$ standard quantization levels is utilized. Taking the example of 4-bit system discussed above, 4 additional levels (M=4) may be added to the standard 16 quantization levels.

The use of such an extended-range multi-bit quantizer further extends the overload ranges of the multi-bit sigma-delta ADC system by allowing the analog input to go over the maximum nominal input value (e.g., +/−1,000 mV) without setting off a limit cycle oscillation. The M=4 additional levels in the above example can provide a buffer zone of +/−250 mV above and below the +/−1,000 mV input range, thereby effectively increasing the overload range from +/−1,000 mV to +/−1,250 mV. This concept of providing an over-bit for the purpose of overload range detection and correction may be extended to any multi-bit sigma-delta ADC systems including low-pass and high-pass multi-bit signal-delta ADC systems.

Figure 6:
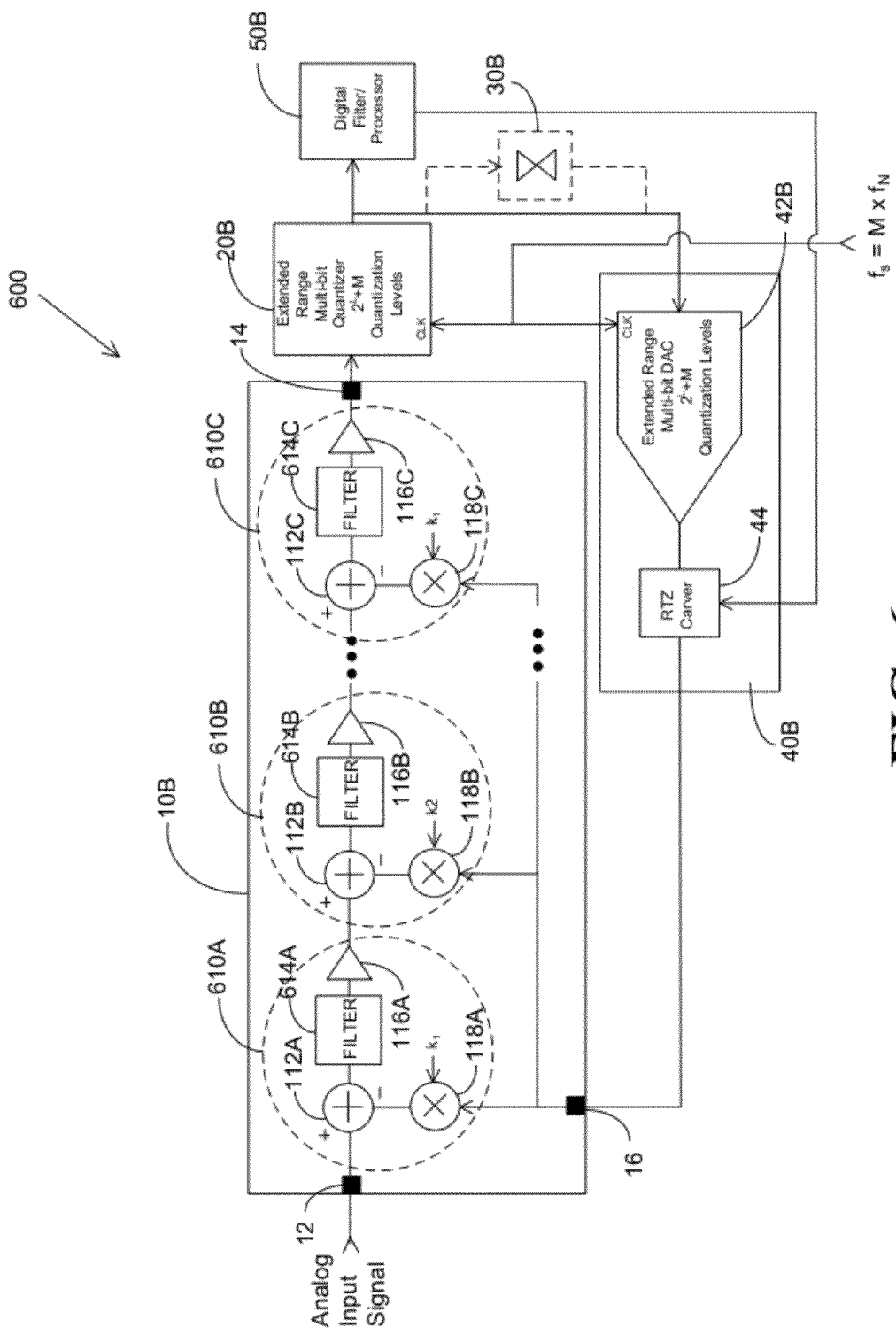
FIG. 6 is a schematic block diagram of an exemplary extended-range multi-bit sigma-delta analog-to-digital conversion system having an extended-range multi-bit quantizer according to one aspect of the subject technology.

FIG. 6 is a schematic block diagram of an exemplary extended-range multi-bit sigma-delta analog-to-digital conversion system 600 according to one aspect of the subject technology. The system 600 may include a filter module 10B, an extended-range multi-bit quantizer 20B, an optional mismatch shaping circuit 30B, a feedback digital-to-analog converter (DAC) module 40B, and a digital filter and/or processor 50B. The following description of the multi-bit sigma-delta conversion system 600 will focus on differences between the system 600 and the multi-bit sigma delta conversion system 100 described above with respect to FIG. 1. In one aspect, the components shown in FIG. 6 that have the same component numbers as those in FIG. 1 can function in a manner that is the same as that of the components shown in FIG. 1.

The filter module 10B is similar to the band-pass filter module 10 described above with respect to FIG. 1 except that each of filters 614A, 614B, and 614C can be a low-pass filter, a band-pass filter, a high-pass filter, or a combination thereof. While the filter module 10B is shown with multiple filter stages 610A, 610B, 610C in the illustrated example of FIG. 6, the filter module 10B may have only one filter stage.

The extended-range multi-bit quantizer 20B may be coupled to the filter module 10B and configured to receive the filtered signal therefrom and to provide a digital representation of the filtered signal after the quantization. Whereas the multi-bit quantizer 20 of FIG. 1 provides $2^L$ levels of quantization, the extended-range multi-bit quantizer 20B of FIG. 6 provides K levels of quantization, where $K=2^L+M$, M being over-quantization levels beyond standard $2^L$ levels of quantization. M can be a positive integer less than $(2^{L+1}-2^L)$. For example, for L=3, M can be 1, 2, 3, 4, 5, 6, or 7. In certain embodiments, the $2^L$th level corresponds to the nominal input range (e.g., +/−1,000 mV), and the over-quantization levels (M) represent a buffer zone such that the analog input signal can exceed the nominal input range (e.g., +/−1,000 mV) without setting off a limit cycle oscillation. The digital representation provided by the extended-range multi-bit quantizer 20B can exceed the standard $2^L$ levels and extend to the $2^L+M$ level. Therefore, the over-bit quantization levels can further extend the overload range of the multi-bit sigma-delta conversion system 600.

In one aspect, the provision of M over-quantization levels over the standard $2^L$ quantization levels is equivalent to a provision of a fractional over-bit of F beyond the standard L bits. Mathematically, $$K=2^L+M \qquad (1)$$

$$K=2^{L+F} \qquad (2)$$

$$F=\log_2(1+M/2^L) \qquad (3)$$

Taking the example of L=4 and M=4 discussed above, the extended-range multi-bit quantizer 20B provides K=20 levels of quantization with a fractional over-bit of 0.322.

Figure 7:
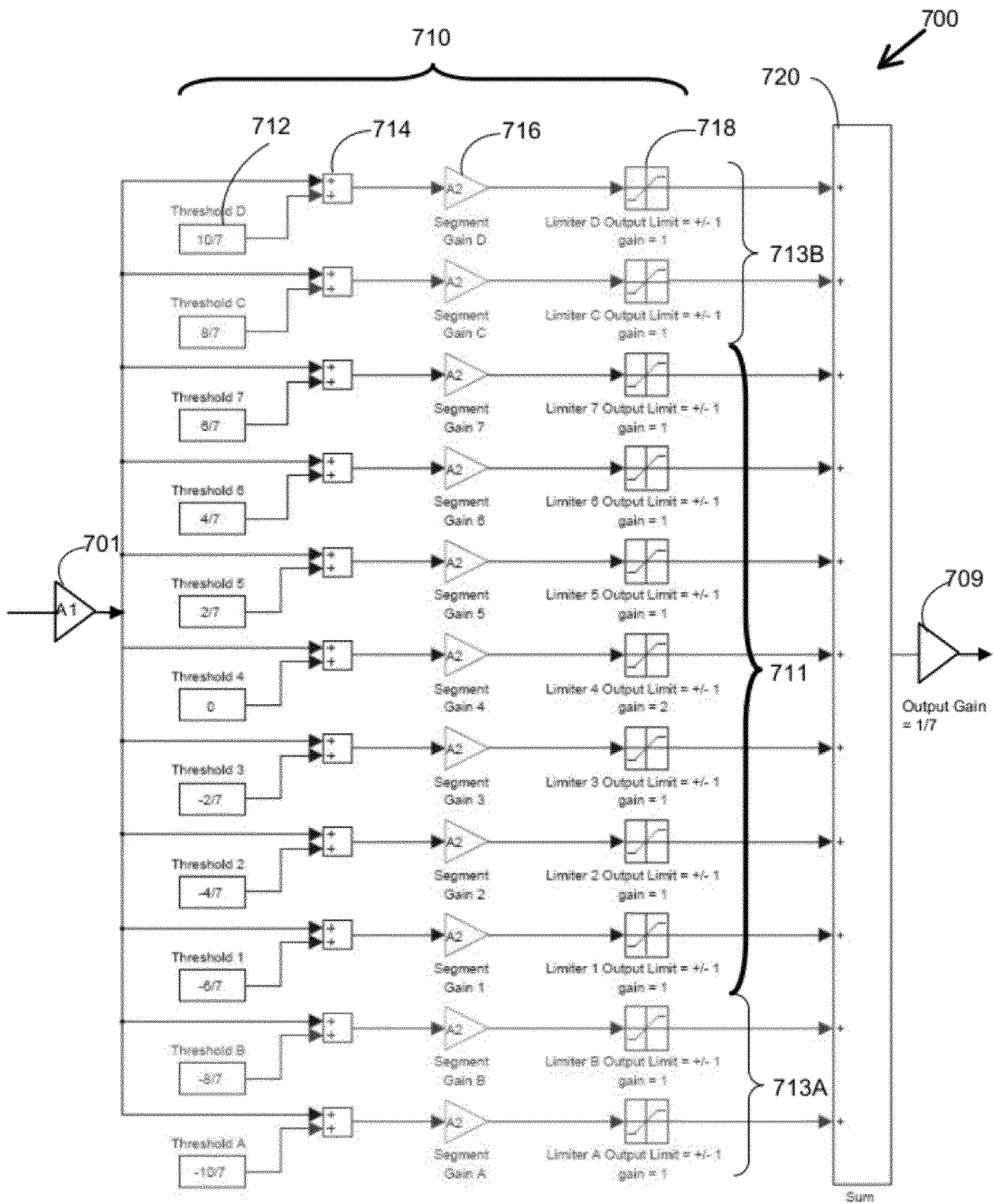
FIG. 7 is a schematic block diagram of an exemplary extended-range multi-bit quantizer according to one aspect of the subject technology.

FIG. 7 is a schematic block diagram of an exemplary multi-bit quantizer 700 having over-quantization levels that can be employed as an extended-range quantizer 20B of FIG. 6 according to one aspect of the subject technology. In the illustrated example, the quantizer 700 is an extended-range 3-bit quantizer having 8 standard quantization levels and 4 over-quantization levels. The illustrated type of quantizer is generally referred to as a thermometer-encoded quantizer as its summed output discrete values rise monotonically as its analog input ascends from a minimum to maximum value.

The quantizer 700 may comprise an input amplifier 701, an output amplifier 709, an output adder 720, and a bank of multiple comparator segments 710 (the "comparator bank"). In this example, the comparator bank 710 includes eleven comparator segments. In particular, the comparator bank 710 includes (i) a standard comparator section 711 comprising 7 comparator segments and (ii) first and second over-range comparator sections 713A, 713B, together comprising 4 additional over-range comparator segments. The 7 comparator segments of the standard comparator section 711 provide 8 quantization levels (3-bits), while the 4 over-range comparator segments of the first and second comparator sections 713A, 713B provide 4 additional over-quantization levels (½ bit).

It shall be appreciated that the quantizer 700 of FIG. 7 is exemplary only, and a multitude of changes including additions, deletions, and modifications may be made to the quantizer 700 without departing from the scope of the present disclosure.

For example, the number of standard comparator segments may be 3, 15, 31, or 63 instead of 7 (e.g., $2^L-1$). The number of over-range comparator segments may be any positive integer between 1 and $(2^{L+1}-2^L-1)$, inclusively. For example, if L is 2, then $2^L$ is 4, $2^{L+1}$ is 8, and $2^L-2^L-1$ is 3. In this example, the number of standard comparator segments is 3 (e.g., $2^2-1=3$), and the number of over-range comparators segments can be 1, 2 or 3.

In the illustrated embodiments of FIG. 7 (L=3), for instance, the number of over-range comparator segments can be 2 instead of 4, providing one over-quantization level on each of positive and negative ends. Alternatively, there may be different number of over-quantization levels (and hence different number of over-range comparator segments) on the positive and negative ends. For example, there may be 4 over-quantization levels on the positive end and 3 over-quantization levels on the negative end. In a sigma-delta ADC system that is expected to receive only a signal of one polarity (e.g., between 0 and 1,000 mV), the quantizer may be configured to have standard $2^3$ levels covering the nominal range and provide a first number of over-quantization levels covering a negative over-range (e.g., between 0 and −125 mV) and a second number of over-quantization levels covering a positive over-range (e.g., between 1,000 and 1,250 mV).

It is possible to have an over-range comparator segment for the negative side only or the positive side only. The minimum number of comparator segments is 1. Of the different choices (e.g., two-sided or one-sided over-range comparator segments), equal two-sided over-range quantization is especially useful for RF applications since most RF signals utilizing sigma-delta ADCs are zero DC waveforms with equal rms values in both the positive and negative signal ranges.

In the example illustrated in FIG. 7, each segment of the comparator bank 710 comprises a threshold reference 712, a multi-input summing junction 714 (e.g., a two-input summing junction), a segment amplifier 716, and a limiter 718. The threshold values and the limiter values shown in FIG. 7 are exemplary only, and other threshold and limiter values may be used. Actual values used in a practical circuit design would vary in accordance with the exact circuit topology and the process technology employed.

Gain (A1) of the input amplifier 701 can be selected so that the analog signal range applied to the seven comparator segments in the standard comparator section 711 would vary from +/−1 of the threshold values indicated in the illustrated example of FIG. 7. Gain (A2) of the segment amplifier 716 is typically selected as large as practical to minimize metastability problems. The analog signal applied to the seven comparator segments in the standard comparator section 711 results in eight values (3 bits) from the output adder 720 (e.g., −7, −5, −3, −1, 1, 3, 5, 7). Gain (1/7) of the output amplifier 709 confines the 3 bit output range to −1 to +1 in steps of 2/7.

Elements 712 can be threshold references (e.g., DC voltage sources) that provide DC voltages to set the comparator switching points (threshold values). The values depicted are examples of system descriptors used in system simulation and analysis. The true DC voltage values may depend on circuit topology and the technology utilized in the design. Elements 714 are summing junctions that may compare the input signal value (e.g., output of amplifier 701) with the threshold values from elements 712. The outputs of the summing junctions are positive if the sum of the input signal and the threshold value is greater than zero and negative if the sum of the input signal and the threshold value is less than zero. Elements 716 are amplifiers which may have infinite gain in an ideal quantizer. A realizable quantizer has finite gain amplifiers in the comparator section with gains which are tradeoffs between several design constraints. Elements 718 may limit the output values of the amplifiers. The limiting values +/−1 depicted in FIG. 7 are examples of systems descriptors used in system simulation and analysis. The true limiting voltage values may depend on circuit configuration and the technology employed in the actual circuit design.

If only the standard comparator section 711 were provided, the quantizer would be saturated at values of +/−1 if the input to the comparator segments exceeds +/−1. This output range saturation can be problematic in feedback systems such as Sigma-Delta ADCs and can set off limit-cycle oscillations. The four over-range comparator segments in the first and second comparator sections 713A, 713B extend the quantizer's output range to +/−11/7 in the illustrated example, giving 12 output quantized values. The ½ over-bit of over-range in the resulting 3½ bit quantizer can help alleviate problems caused by input over-range in quantized feedback systems.

Returning to FIG. 6, the feedback DAC module 40B includes a DAC 42B and an RTZ carver 44. In the illustrated example of FIG. 6, the DAC 42B is an extended-range multi-bit DAC. In some embodiments, the extended-range multi-bit DAC 42B has the same (K) quantization levels as the extended-range multi-bit quantizer 20B.

As with the processor 50 of FIG. 1, the processor 50B is configured to perform various digital processing operations (e.g., filtering, demodulation, and decoding) on the multi-bit digital representation to extract information carried by the analog input signal as part of providing, for example, a software-defined radio system.

In certain embodiments, the extended-range multi-bit sigma delta analog-to-digital conversion system 600 further includes an amplifier configured to receive an analog signal and provide an amplified analog signal. The amplifier can be placed before the filter module 10B, between the filter module 10B and the extended-range multi-bit quantizer 20B, or within the quantizer 20B itself (e.g., 701 of FIG. 7). In certain embodiments, the amplifier is a variable gain amplifier whose gain can be controllably selected by the processor 50B. In some of such embodiments, the processor 50B may be configured to receive the multi-bit digital representation and determine whether an overload condition exists (e.g., whether the analog input signal exceeds a nominal input range). This can be achieved, for example, by comparing the digital representation to $2^L$. If the digital representation is greater than $2^L$, which, in certain embodiments, corresponds to the nominal input range, the processor determines that an overload condition exists. The processor, after detecting the overload condition, can change a gain of the VGA so as to bring the amplitude of the analog input signal within the nominal input range for the system 600.

Figure 8:
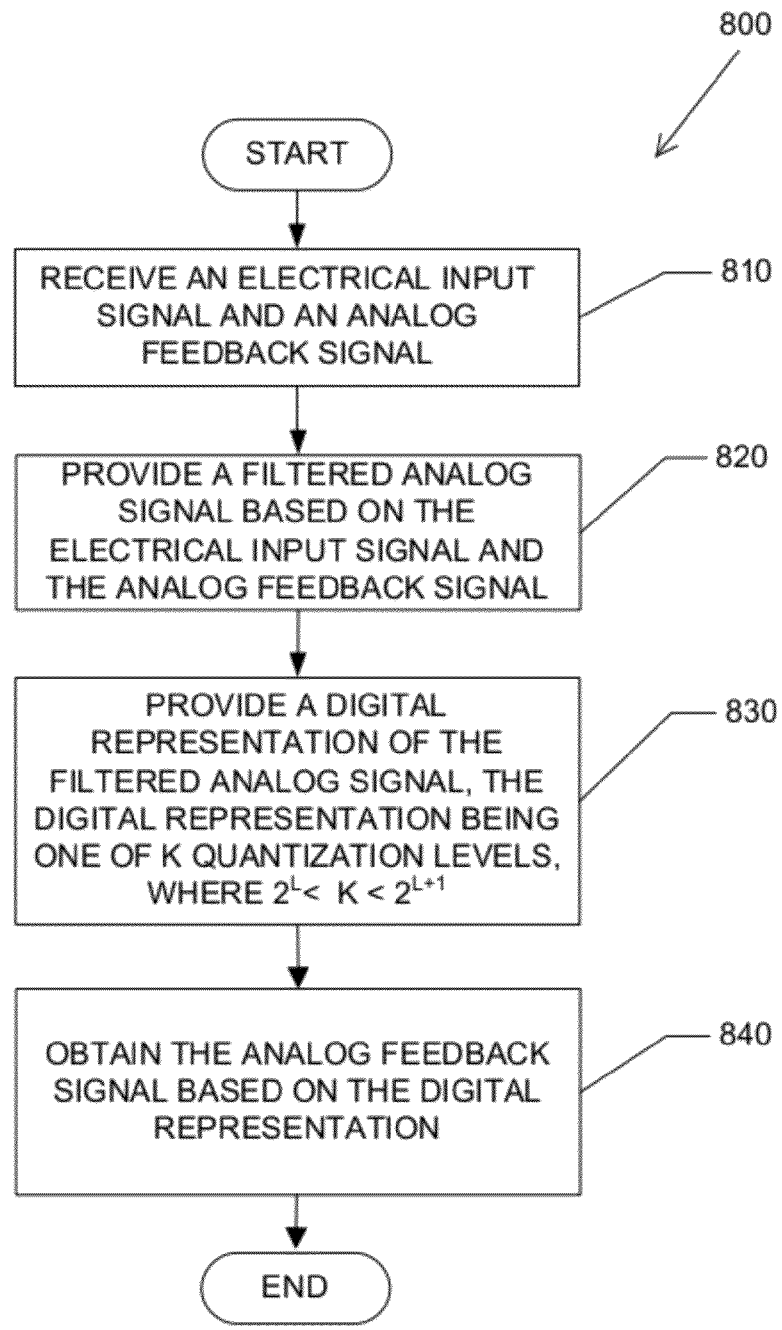
FIG. 8 is a flowchart illustrating an exemplary process for performing a sigma-delta analog-to-digital conversion of an analog signal by the use of an extended-range multi-bit quantizer according to one aspect of the subject technology.

FIG. 8 is a flowchart illustrating an exemplary process 800 for performing a sigma-delta analog-to-digital conversion of an analog signal (e.g., RF signal) by the use of an extended-range multi-bit quantizer according to one aspect of the subject technology. For ease of illustration, various operations of the process 800 will be described with respect to the exemplary extended-range multi-bit sigma-delta analog-to-digital conversion system 600 of FIG. 6. However, it shall be appreciated by those skilled in the art that the process 800 or a variation thereof can be implemented in a different configuration of multi-bit sigma-delta analog-to-digital conversion system without departing from the scope of the present disclosure. The process 800 begins at start state and proceeds to operation 810, in which an analog electrical input signal to be digitized is received and an analog feedback signal are received, e.g., by the filter module 10B. The process 800 proceeds to operation 820, in which a filtered analog signal that is generated based on the analog input signal and the analog feedback signal is provided, e.g., by the filter module 10. The operation 820 can include filtering. In certain embodiments, the filtering includes low-pass filtering. In other embodiments, the filtering includes band-pass filtering. In yet other embodiments, the filtering includes high-pass filtering. The filtering can include multi-stage filtering by multiple filter stages (e.g., 610A, 610B, . . . , 610C) or a single-stage filtering by one filter module.

The process 800 proceeds to operation 830, in which a multi-bit digital representation of the filtered analog signal is provided, e.g., by the extended-range multi-bit quantizer 20B. The digital representation is one of K quantization levels, wherein K is a positive integer between $2^L$ and $2^{L+1}$, L being a positive integer.

The process 800 proceeds to operation 840, in which an analog representation of the multi-bit digital representation is provided, e.g., by the extended-range multi-bit DAC 42B. Optionally, the operation 840 can include a return-to-zero carving operation performed on the analog representation, e.g., by the RTZ carver circuit 44. As explained above, the analog feedback signal is used e.g., by the filter module 10B in conjunction with the analog input signal to provide the filtered analog signal.

Although not shown in FIG. 8, additional digital processing operations (e.g., filtering, demodulation, and decoding) may be performed on the multi-bit digital representation to extract information carried by the analog input signal as part of providing, for example, a software-defined radio system. Optionally, the digital processing operations can further include determining whether an overload condition exists based on the multi-bit digital representation. The determining can comprise comparing the digital representation to $2^L$. In some embodiments, the digital processing functions can further include reducing the gain of a variable gain amplifier so as to bring the amplitude of the analog input signal within the nominal input range.

The subject technology has been described with particular illustrative configurations. It is to be understood that the subject technology is not limited to the above-described configurations and that various changes and modifications may be made by those of ordinary skill in the art without departing from the scope of the subject technology.

In one aspect of the disclosure, a sigma-delta analog-to-digital conversion system for data conversion of an electrical input signal may comprise some or all of the following: a filter module configured to receive an electrical input signal and an analog feedback signal and to provide a filtered signal; an extended-range multi-bit quantizer coupled to the filter module and configured to provide a digital representation of the filtered signal, the quantizer having K quantization levels, K being a positive integer between $2^L$ and $2^{L+1}$, L being a positive integer; and a feedback digital-to-analog converter (DAC) module coupled to the extended-range multi-bit quantizer and configured to provide the analog feedback signal to the filter module, the feedback DAC module comprising a digital-to-analog converter configured to provide an analog representation of the digital representation. L can be 1, 2, 3, 4, or 5. K can be $2^L+M$, M being over-quantization levels provided in addition to $2^L$ quantization levels. K can be $2^{L+F}$, F being a fractional over-bit provided in addition to L integer bits. The digital-to-analog converter can have K quantization levels. The filter module can comprise a low-pass filter. The filter module can comprise a high-pass filter. The filter module can comprise a band-pass filter. The filter module can comprise a plurality of filter stages. Each of the plurality of filter stages can comprise a filter and an amplifier. The extended-range multi-bit quantizer can comprise a flash analog-to-digital converter. The extended-range multi-bit quantizer can comprise K comparator segments, each of the K comparator segments comprising a threshold reference, a two-input summing junction, an amplifier, and a limiter. The two-input summing junction can be configured to receive the filtered signal and a reference signal from the threshold reference, and to provide a summed signal that represents a sum of the filtered signal and the reference signal. The amplifier can be configured to receive the summed output and provide an amplified summed signal. The limiter can be configured to provide either −1 or +1 depending on whether the amplified summed signal is negative or positive. The system can further comprise a processor configured to receive the digital representation and detect an overload condition based on the digital representation. The system can further comprise a variable gain amplifier configured to vary an amplitude of an analog signal provided to the extended-range multi-bit quantizer. The processor can be further configured to reduce gain of the variable gain amplifier if the overload condition is detected.

In one aspect of the disclosure, a method of performing a sigma-delta analog-to-digital conversion of an electrical input signal may comprise some or all of the following: receiving an electrical input signal; providing a filtered analog signal based on the electrical input signal and an analog feedback signal; providing a digital representation of the filtered analog signal, the digital representation being one of K quantization levels, wherein K is a positive integer between $2^L$ and $2^{L+1}$, L being a positive integer; and obtaining the analog feedback signal based on the digital representation. The obtaining can comprise performing a digital-to-analog conversion of the digital representation. The method can further comprise determining whether an overload condition exists based on the digital representation. The determining can comprise comparing the digital representation to $2^L$. The filtering can comprise low-pass filtering. The filtering can comprise band-pass filtering. The providing the digital representation can comprise producing a sum of the filtered analog signal and a threshold reference value, providing a comparison output value based on the sum, the comparison output being positive if the sum is greater than zero and negative if the sum is less than zero, amplifying the comparison output value, and limiting the comparison output value after the amplification to one of +1 and −1.

Those of skill in the art would appreciate that the various illustrative blocks, modules, elements, components, methods, and algorithms described herein may be implemented as electronic hardware, computer software, or combinations of both. For example, the digital filter and/or processor 50, 50B may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology. For example, the bandpass multi-bit sigma-delta analog-to-digital conversion system can utilize a different type or configuration of bandpass filter(s) than what is shown by the bandpass filter module of FIG. 1. Although the conversion system shown in FIG. 1 employs a single feedback DAC module, a plurality of feedback DAC modules, one for each filter stage, may be employed instead, in which case the separate multipliers 118A, 118B, 118C may not be necessary. In one aspect, the term ADC may refer to analog-to-digital conversion, analog-to-digital converter or the like, and term DAC may refer to digital-to-analog conversion, digital-to-analog converter or the like.

It is understood that the specific order or hierarchy of steps in the processes disclosed is an illustration of exemplary approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

The previous description is provided to enable any person skilled in the art to practice the various aspects described herein. The previous description provides various examples of the subject technology, and the subject technology is not limited to these examples. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the invention.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples. A phrase such an embodiment may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such a configuration may refer to one or more configurations and vice versa.

The word "exemplary" is used herein to mean "serving as an example or illustration." Any aspect or design described herein as "exemplary" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

The invention claimed is:

1. A sigma-delta analog-to-digital conversion system for data conversion of an electrical input signal, the system comprising:
   a filter module configured to receive an electrical input signal and an analog feedback signal and to provide a filtered signal;
   an extended-range multi-bit quantizer coupled to the filter module and configured to provide a digital representation of the filtered signal, the quantizer having K quantization levels, K being a positive integer between $2^L$ and $2^{L+1}$, L being a positive integer; and
   a feedback digital-to-analog converter (DAC) module coupled to the extended-range multi-bit quantizer and configured to provide the analog feedback signal to the filter module, the feedback DAC module comprising a digital-to-analog converter configured to provide an analog representation of the digital representation,
   wherein the extended-range multi-bit quantizer comprises a flash analog-to-digital converter.

2. The system of claim 1, wherein L is 1, 2, 3, 4, or 5.

3. The system of claim 1, wherein $K=2^L+M$, M being over-quantization levels provided in addition to $2^L$ quantization levels.

4. The system of claim 1, wherein $K=2^{L+F}$, F being a fractional over-bit provided in addition to L integer bits.

5. The system of claim 1, wherein the digital-to-analog converter comprises K quantization levels.

6. The system of claim 1, wherein the filter module comprises a low-pass filter.

7. The system of claim 1, wherein the filter module comprises a high-pass filter.

8. The system of claim 1, wherein the filter module comprises a band-pass filter.

9. The system of claim 1, wherein the filter module comprises a plurality of filter stages.

10. The system of claim 9, wherein each of the plurality of filter stages comprises a filter and an amplifier.

11. The system of claim 1, wherein the extended-range multi-bit quantizer comprises K comparator segments, each of the K comparator segments comprising a threshold reference, a two-input summing junction, an amplifier, and a limiter, wherein the two-input summing junction is configured to receive the filtered signal and a reference signal from the threshold reference, and to provide a summed signal that represents a sum of the filtered signal and the reference signal, the amplifier is configured to receive the summed signal and provide an amplified summed signal, and the limiter is configured to provide either −1 or +1 depending on whether the amplified summed signal is negative or positive.

12. The system of claim 1, further comprising a processor configured to receive the digital representation and detect an overload condition based on the digital representation.

13. The system of claim 12, further comprising a variable gain amplifier configured to vary an amplitude of an analog signal provided to the extended-range multi-bit quantizer, wherein the processor is further configured to reduce a gain of the variable gain amplifier if the overload condition is detected.

14. A method of performing a sigma-delta analog-to-digital conversion of an electrical input signal, the method comprising:

receiving an electrical input signal;

providing a filtered analog signal based on the electrical input signal and an analog feedback signal;

providing a digital representation of the filtered analog signal, the digital representation being one of K quantization levels, wherein K is a positive integer between $2^L$ and $2^{L+1}$, L being a positive integer, and wherein $K=2^L+M$, M being over-quantization levels provided in addition to $2^L$ quantization levels; and obtaining the analog feedback signal based on the digital representation.

15. The method of claim 14, wherein the obtaining comprises performing a digital-to-analog conversion of the digital representation.

16. The method of claim 14, further comprising determining whether an overload condition exists based on the digital representation.

17. The method of claim 16, wherein the determining comprises comparing the digital representation to $2^L$.

18. The method of claim 14, wherein the filtering comprises low-pass filtering.

19. The method of claim 14, wherein the filtering comprises band-pass filtering.

20. The method of claim 14, wherein the providing the digital representation comprises:

producing a sum of the filtered analog signal and a threshold reference value;

providing a comparison output value based on the sum, the comparison output value being positive if the sum is greater than zero and negative if the sum is less than zero;

amplifying the comparison output value; and limiting the comparison output value after the amplification to one of +1 and −1.

21. The method of claim 14, wherein the filtering comprises high-pass filtering.

* * * * *